United States Patent
Abe et al.

(10) Patent No.: US 7,153,453 B2
(45) Date of Patent: Dec. 26, 2006

(54) OXIDE SINTERED BODY, SPUTTERING TARGET, TRANSPARENT CONDUCTIVE THIN FILM AND MANUFACTURING METHOD THEREFOR

(75) Inventors: Yoshiyuki Abe, Chiba-ken (JP); Tokuyuki Nakayama, Chiba-ken (JP); Go Ohara, Tokyo (JP); Riichiro Wake, Tokyo (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

(21) Appl. No.: 11/115,971

(22) Filed: Apr. 27, 2005

(65) Prior Publication Data

US 2005/0239660 A1 Oct. 27, 2005

(30) Foreign Application Priority Data

Apr. 27, 2004 (JP) ............................. 2004-131476

(51) Int. Cl.
*H01B 1/08* (2006.01)
*B32B 15/04* (2006.01)
*C23C 14/00* (2006.01)

(52) U.S. Cl. ............................. 252/519.51; 252/520.5; 204/192.29; 428/918

(58) Field of Classification Search ............. 252/518.1, 252/520.5, 519.51; 204/192.29; 428/917, 428/918, 922
See application file for complete search history.

(56) References Cited

FOREIGN PATENT DOCUMENTS

| JP | 7-235219 | * | 9/1995 |
| JP | 2005-268113 A2 | * | 9/2005 |
| JP | 2006-160535 A2 | * | 6/2006 |

* cited by examiner

*Primary Examiner*—Mark Kopec
(74) *Attorney, Agent, or Firm*—Katten Muchin Rosenman LLP

(57) ABSTRACT

There is provided an amorphous transparent conductive thin film with a low resistivity, a low absolute value for the internal stress of the film, and a high transmittance in the visible light range, an oxide sintered body for manufacturing the amorphous transparent conductive thin film, and a sputtering target obtained therefrom. An oxide sintered body is obtained by: preparing $In_2O_3$ powder, $WO_3$ powder, and ZnO powder with an average grain size of less than 1 μm so that tungsten is at a W/In atomic number ratio of 0.004 to 0.023, and zinc is at a Zn/In atomic number ratio of 0.004 to 0.100; mixing the prepared powder for 10 to 30 hours; granulating the obtained mixed powder until the average grain size is 20 to 150 μm; molding the obtained granulated powder by a cold isostatic press with a pressure of 2 to 5 ton/cm$^2$, and sintering the obtained compact at 1200 to 1500 degree.C. for 10 to 40 hours in an atmosphere where oxygen is introduced into the atmosphere of the sinter furnace at a rate of 50 to 250 liters/min per 0.1 m$^3$ furnace volume.

17 Claims, No Drawings

OXIDE SINTERED BODY, SPUTTERING TARGET, TRANSPARENT CONDUCTIVE THIN FILM AND MANUFACTURING METHOD THEREFOR

BACKGROUND OF THE INVENTION

1. Field of the Invention

The present invention relates to an amorphous transparent conductive thin film with a low internal stress and a low resistivity used in solar batteries, display elements such as liquid crystal display (LCD) elements, organic electroluminescence (EL) elements, inorganic EL elements, and touch panels, an oxide sintered body used as a raw material when manufacturing the transparent conductive thin film by a DC sputtering method, and a sputtering target which uses the oxide sintered body.

2. Description of the Related Art

A transparent conductive thin film has a high conductivity (for example, a resistivity of $1\times10^{-3}$ ohm-cm or less) and a high transmittance in the visible light range. Therefore, besides being used in electrodes in solar batteries, liquid crystal display elements, and other kinds of light-receiving elements, it is also used as a heat reflecting film for automobile windows and building windows, as various kinds of antistatic films, and in anti-fog transparent heating elements for refrigerated showcases.

For the transparent conductive thin film, tin oxide ($SnO_2$) films doped with antimony or fluorine, zinc oxide (ZnO) films doped with aluminum or gallium, and indium oxide ($In_2O_3$) films doped with tin, and the like, are widely used. In particular, the indium oxide film doped with tin, that is to say an $In_2O_3$—Sn film, called ITO (indium tin oxide) film, is often used because of the ease in which a transparent conductive thin film with a low resistivity can be obtained.

As a method of manufacturing these transparent conductive thin films, the sputtering method is often used. The sputtering method is an effective technique in a case where a material with a low vapor pressure is used to form a film on a film formation substrate material (hereunder, simply referred to as "substrate"), or when precise film thickness control is needed, and is widely used because of the high degree of convenience of its operation.

In the sputtering method, it is common to use a raw material containing the desired component of the film as a target. In this method, a vacuum apparatus is generally used, and after the vacuum vessel containing the arranged target and substrate has been brought to a high vacuum, a noble gas, such as argon, is introduced, and under a gas pressure of approximately 10 Pa or less, the substrate is made the anode, the target is made the cathode, and argon plasma is generated by initiating a glow discharge between them. The positive argon ions in the plasma are thus made to collide with the target, which is the cathode. As a result, the particles of the target component are expelled, and the particles are made to accumulate on the substrate, forming a film.

The sputtering method is classified according to the method of generating the argon plasma. A method using radio-frequency plasma is called a radio-frequency sputtering method, and a method using DC plasma is called a DC plasma sputtering method. In contrast to the radio-frequency sputtering method where it is possible to form a film even with a nonconductive target, in the DC sputtering method it is necessary to use a conductive target. However, generally, the DC sputtering method has, a faster film formation speed compared to the radio-frequency sputtering method, inexpensive power-supply equipment, and the film formation operation is simple, and for these reasons, it is widely used industrially.

The film formation speed of sputtering is closely related to the chemical bonding of the target material. Sputtering is a phenomenon that occurs when positive argon ions having kinetic energy collide with the target surface, and the target surface matter which receives the energy is expelled. Therefore, the weaker the interionic bonding or interatomic bonding of the target material, the higher the probability of expulsion by sputtering.

The electrodes for LCDs, organic EL elements, and the like, require a transparent conductive thin film with a smooth surface. In particular, in the case of an electrode for an organic EL element, a high surface smoothness is demanded of the transparent conductive thin film, because super thin films of organic compounds are formed on top of them. Surface smoothness is, generally, greatly affected by the crystallinity of the film. Even with the same composition, a transparent conductive thin film (amorphous film) with an amorphous structure in which there are no grain boundaries, has a more favorable surface smoothness compared to a transparent conductive thin film (crystalline film) with a crystalline structure.

Even in the case of an ITO film with a conventional composition, the amorphous ITO film obtained by decreasing the substrate temperature at the time of film formation when performing sputtering film formation at low temperature (150 degree.C. or less) and at high gas pressure (1 Pa or more), has a superior surface smoothness. The limit of the resistivity of the amorphous ITO film is $9\times10^{-4}$ ohm-cm, and to form a film with a small surface resistance it is necessary for the film itself to be formed thick. However, when the film thickness of the ITO film becomes thick, a problem of coloring arises.

Furthermore, even regarding an ITO film in which film formation occurred at room temperature without heating of the substrate, if the sputtering gas pressure is low, the kinetic energy of the sputter particles injected into the substrate is high, locally increasing the temperature, and resulting in a film formed by minute crystal phases and amorphous phases. The presence of minute crystal phases can be confirmed by, as well as X-ray diffraction, transmission electron microscopes and electron diffraction.

When such minute crystalline phases have formed in one part, it causes a large effect on the surface smoothness. Furthermore, upon etching removal of the transparent conductive thin film to a predetermined shape by a weak acid, there is a problem in that only the crystalline phase is unable to be removed and remains in some instances.

On the other hand, the amorphous ITO film has, as well as a problem of resistivity, a problem of stability. In a situation where an amorphous ITO film is used as an electrode for LCDs, or organic EL elements, or the like, in the manufacturing process, heating to above 150 degree.C. is performed after electrode formation, and the transparent conductive thin film crystallizes as a result. The reason for this is that the amorphous phase is a metastable phase. If the amorphous phase crystallizes, a crystal grain is formed, and a problem arises in that the surface smoothness worsens, and at the same time there is large change in the resistivity.

Next, the organic EL element is described. The EL element uses electroluminescence. It has a high visibility because of self-luminescence, and is a completely solid-state element. As a result, the EL element has advantages such as superior shock resistance, and the use of EL elements as light emission elements in various types of display devices is receiving much attention.

For EL elements, inorganic EL elements using inorganic compounds as the luminescent material, and organic EL elements using organic compounds exist. Among these, because the organic EL elements are able to greatly lower the drive voltage and are easy to miniaturize, they are being aggressively researched for practical use as the next generation of display elements. An organic EL element has a basic configuration of an anode/luminescent layer/cathode lamination, and a configuration where a transparent anode is formed on a substrate using a glass plate and the like, is normally employed. In this case, the luminescence is taken out from the substrate side.

Incidentally, in recent years, for the following reasons, attempts have been made to take out the luminescence from the cathode side by making the cathode transparent. By making the anode transparent along with the cathode, an entirely transparent light emission element can be made. Accordingly, as a background color of the transparent light emission element, an arbitrary color can be employed, also allowing it to be a colorful display when not luminescent, thus improving its decorativeness. Furthermore, in a case where black is employed as the background color, there is an advantage in that the contrast improves at the time of luminescence. Moreover, it is possible to use color filters and color conversion layers, and to place these on top of the light emission element. As a result, the light emission element can be produced without consideration for color filters and color conversion layers. Accordingly, the anode can be formed separately to the color filters and color conversion layers which are inferior in heat resistance. Therefore it is possible to raise the substrate temperature when forming the anode, and as a result the value of resistance of the anode can be lowered.

By making the cathode transparent, such advantages can be obtained. Therefore production of organic EL elements using transparent cathodes is being trialed.

For example, the organic EL element described in Japanese Patent Application Publication No. H10-162959, consist of a structure where an organic layer containing an organic luminescent layer lies between the anode and cathode, the cathode is constructed by an electron injecting metal layer and an amorphous transparent conductive layer, and the electron injecting metal layer touches the organic layer.

Furthermore, in Japanese Patent Application Publication No. 2001-43980 there is disclosed an organic EL element devised to efficiently take out the light from the cathode by making the cathode transparent and using an optically reflecting metal film for the anode.

Next, each layer in the structure of the organic EL element is described. Firstly, regarding the electron injecting metal layer, this is a metallic layer which is able to satisfactorily inject electrons into the organic layer which contains the luminous layer. To obtain a transparent light emission element, it is favorable for the electron injecting metallic layer to have a light transmittance of at least 50%. Therefore, it is necessary for the film thickness of the layer to be a super thin film of approximately 0.5 nm to 20 nm.

Specifically, the electron injecting metallic layer includes films with a film thickness of 1 nm to 20 nm using a metal (electron injecting metal) with a work function of 3.8 eV or less, for example, Mg, Ca, Ba, Sr, Li, Yb, Eu, Y and Sc. In this case, a structure is desired where a light transmittance of at least 50%, and preferably 60% or more is obtained.

The organic layer which lies between the anode and the cathode contains at least, a luminous layer. The organic layer may consist of only a luminous layer, or it may be a multilayered construction where, as well a luminous layer, a hole injection transportation layer and the like, is laminated. In the organic EL element, the organic layer has functions such as; (1) a function where at the time of application of an electric field, it is able to receive an injection of holes from the anode or hole transportation layer, as well as being able to receive an injection of electrons from the electron injecting layer, (2) a transportation function which moves the injected electric charges (electrons and holes) by the force of the electric field, and (3) a luminescence function to provide a place inside the luminous layer where the electrons and holes recombine, linking this to the luminescence.

The hole injection transportation layer is a layer consisting of a hole conduction compound, and has a function to transmit holes injected from the anode to the luminous layer. By placing the hole injection transportation layer between the anode and the luminous layer, more holes are injected to the luminous layer under a lower electric field. Furthermore, the electrons injected to the luminous layer from the electron injection layer accumulate near the interface inside the luminous layer due to the barrier of electrons present at the interface between the luminous layer and the hole injection transportation layer. As a result, the luminous efficiency of the organic EL element can be improved, and an organic EL element with superior light emission performance can be obtained.

Next, the anode is described. The anode is not particularly restricted provided it exhibits a work function of at least 4.4 eV, and preferably a conductivity of at least 4.8 eV. A metal with a work function of at least 4.8 eV, or a transparent conductive thin film, or a combination of these, is preferable.

It is not necessary for the anode to be transparent in all cases, and it may be coated with a black carbon layer, or the like. Examples of suitable metals include Au, Pt, Ni and Pd. Furthermore, examples of conducting oxides include In—Zn—O, In—Sn—O, ZnO—Al, and Zn—Sn—O. Examples of laminated bodies include an Au and In—Zn—O laminated body, a Pt and In—Zn—O laminated body, and an In—Sn—O and Pt laminated body.

Furthermore, it is acceptable if the interface between the organic layer and the anode has a work function of at least 4.4 eV. Therefore the anode can be double-layered, and a conductive film with a work function of 4.4 eV or less can be used on the side which does not touch the organic layer. In this case, metals such as Al, Ta and W, and alloys such as Al alloys, and Ta—W alloys can be used. Furthermore, conducting polymers such as doped polyaniline and doped polyphenylene vinylene, and amorphous semiconductors such as a-Si, a-SiC, and a-C can also be used. In addition, black semiconducting oxides such as $Cr_2O_3$, $Pr_2O_5$, NiO, $Mn_2O_5$, and $MnO_2$ may be used.

Next, the cathode is described. It is desirable for the transparent conductive layer which constitutes the cathode of the organic EL element to be an amorphous film with a small internal stress and a superior smoothness. Furthermore, it is preferable for the resistivity value to be $9 \times 10^{-4}$ ohm-cm or less, in order to remove voltage drop and nonuniformity of luminescence caused thereby.

To realize a transparent conductive thin film with a superior surface smoothness, and which is stable even under the heat history of the production process, is impossible with conventional ITO materials, and accordingly, it is difficult to use these in transparent electrodes in display elements such as organic EL displays and LCDs.

As an amorphous film, zinc added indium oxide has been described in Japanese Patent Application Publication No. H7-235219. This publication introduces where the Zn element content is 10 at % to 20 at % with respect to the total amount of the Zn element and the In element, and a stable amorphous nature and a high conductivity is shown.

However, the film with the composition introduced here had a shortcoming in that the optical transparency at shorter wavelengths of visible light, in particular at wavelengths near 400 nm, was low.

Furthermore, an indium oxide thin film containing tungsten at a W/In atomic number ratio of 0.004 to 0.047 is described in Japanese Patent Application Publication No. 2004-52102, and shows stability in obtaining an amorphous film, and a high conductivity. However, in manufacture by the sputtering method, there is a shortcoming in that it is difficult to obtain a film with an internal stress with an absolute value of $1 \times 10^{10}$ dyn/cm$^2$ or less (that is to say $-1 \times 10^{10}$ dyn/cm$^2$ to $1 \times 10^{10}$ dyn/cm$^2$).

Moreover, if productivity and the reduction of production costs are considered, there is a necessity to employ the DC sputtering method, and to perform high-speed film formation using a high DC power. However, it is becoming understood that depending on the additional elements to the sputtering target for manufacturing an indium oxide thin film, if a high DC power is applied, arcing can occur in some cases, making it impossible for high-speed film formation. If arcing occurs at the time of film formation, it becomes a cause of a generation source of particles, which causes a decrease in product yield. If arcing occurs continuously, formation of the film itself is hindered.

Furthermore, as the sputtering target is used in sputtering, it gradually becomes a state where it is pitted in parts. However, the fact that it can be used with its sputtering characteristics constant up until just before being all used up, is useful from the aspect of material costs. However, depending on the sputtering target, as the integrated value of the applied power increases, nodules (black protrusions on the target surface) occur on the surface of the sputtering target, causing problems such as the occurrence of arcing, and a decrease in the film formation speed.

For a sputtering target for which arcing occurs on a small scale, arcing can be avoided by using a power supply having an arcing control function. As a method for controlling arcing, there is the DC pulsing method (method of neutralizing the charge (electrostatic charge) on the target by periodically stopping the negative voltage applied to the target and applying a low positive voltage during that time), and there is a method of installing an arc-blocking circuit (a circuit that detects an increase in the discharge current when arcing occurs, and stops the power supply before it can grow into full arcing, then restarts the power supply after the current flowing to the target drops sufficiently) (refer to "Transparent Conductive Film Technology", Ohmsha, pg. 193 to 195).

However, a power supply having such arcing control functions is very expensive, thus increasing equipment cost. Furthermore, even when a power supply having such arcing control functions is used, it does not mean that arcing can be completely controlled.

[Patent Document 1] Japanese Patent Application Publication No. H10-162959.

[Patent Document 2] Japanese Patent Application Publication No. 2001-43980.

[Patent Document 3] Japanese Patent Application Publication No. H7-235219.

[Patent Document 4] Japanese Patent Application Publication No. 2004-52102.

[Non Patent Document 1] "Transparent Conductive Film Technology", Ohmsha, pg. 82, pg. 193 to 195.

SUMMARY OF THE INVENTION

An object of the present invention is to provide an oxide sintered body for manufacturing an amorphous transparent conductive thin film with low resistivity, low absolute value for the internal stress of the film, high transmittance in the visible light range, particularly at low wavelengths (400 nm), and a sputtering target obtained therefrom. In particular, in film formation by the DC sputtering method where a power source without an arcing control function is used, it is difficult for arcing to occur even when a high DC power is applied, and it is difficult for cracks to occur. Accordingly, an object is to provide a sputtering target where high-speed film formation is possible, and nodules and arcing will not occur, even when the power is applied for a long period of time.

An oxide sintered body of the present invention comprises indium, tungsten and zinc, wherein tungsten is contained at a W/In atomic number ratio of 0.004 to 0.023, zinc is contained at a Zn/In atomic number ratio of 0.004 to 0.100, and resistivity is 1 k ohm-cm or less.

Another aspect of an oxide sintered body of the present invention comprises indium, tungsten, zinc and silver, wherein tungsten is contained at a W/In atomic number ratio of 0.004 to 0.023, zinc is contained at a Zn/In atomic number ratio of 0.004 to 0.100, silver is contained at an Ag/In atomic number ratio of 0.001 to 0.010, and resistivity is 1 k ohm-cm or less.

Preferably the resistivity of the oxide sintered body of the present invention, in either aspect, is $1 \times 10^{-1}$ ohm-cm or less.

Furthermore, a bixbyite type indium oxide crystalline phase as the main phase is preferable. Moreover, the average crystalline grain size in the crystalline phase is 10 μm or less. In addition, it is preferable that essentially a tungsten oxide crystalline phase is not included.

In the oxide sintered body of the present invention, in either aspect, it is preferable for the sintered body density to be 6.2 g/cm$^3$ or more. Furthermore it is preferable for the average value of the crystalline grain size to be 10 μm or less.

A sputtering target of the present invention is obtained by processing the aforementioned oxide sintered body into a tabular form, and attaching it to a cooling metal plate (backing plate). Preferably a maximum height Rz of the sputtering face of the sputtering target is 3.0 μm or less.

An amorphous transparent conductive thin film of the present invention is characterized in that a film is formed on a substrate using the aforementioned sputtering target, by the sputtering method, and the absolute value of the internal stress of the film is $1 \times 10^{10}$ dyn/cm$^2$ or less, and the resistivity is $9 \times 10^{-4}$ ohm-cm or less.

A method of manufacturing an oxide sintered body of the present invention comprises the steps of: preparing In$_2$O$_3$ powder with an average grain size of 1 μm or less, WO$_3$ powder with an average grain size of 1 μm or less, and ZnO powder with an average grain size of 1 μm or less, so that tungsten is at a W/In atomic number ratio of 0.004 to 0.023, and zinc is at a Zn/In atomic number ratio of 0.004 to 0.100, mixing the prepared powder for 10 to 30 hours; granulating the obtained mixed powder until the average grain size is 20 to 150 μm; molding the obtained granulated powder by a cold isostatic press with a pressure of 2 to 5 ton/cm$^2$; and sintering the obtained compact at 1200 to 1500 degree.C. for 10 to 40 hours in an atmosphere where oxygen is introduced into the atmosphere of a sinter furnace at a rate of 50 to 250 liters/min per 0.1 m³ furnace volume.

Preferable in the sintering step, the temperature is raised by 0.5 to 3 degree.C./min, and in cooling after sintering, after oxygen introduction has been stopped, the temperature is decreased by 0.1 to 1 degree.C./min to 1000 degree.C.

Furthermore, preferably a reductive process is conducted to further heat the obtained oxide sintered body under a nonoxidizing atmosphere. As a result, it is possible to further reduce the resistivity.

A method of manufacturing a sputtering target of the present invention comprises: processing the oxide sintered body obtained by the aforementioned manufacturing method into a tabular form; grinding the sputtering face thereof so that the maximum height Rz is 3.0 µm or less, and then sticking the oxide sintered body to a cooling metal plate.

A method of manufacturing an amorphous transparent conductive thin film of the present invention comprises at the time of film formation of the amorphous transparent conductive thin film on a substrate by a sputtering method, using the aforementioned sputtering target, making the target-substrate distance at the time of sputtering 80 to 150 mm, and making the sputtering gas pressure 0.8 to 1.5 Pa, for film formation.

Even if the above-mentioned film formation does not specifically have an arcing control function, it can be performed by the DC sputtering method.

According to the present invention, if an oxide sintered body containing indium, tungsten, and zinc at predetermined atomic number ratios, with a resistivity of 1 k ohm-cm or less, or an oxide sintered body containing indium, tungsten, zinc, and silver at predetermined atomic number ratios, with a resistivity of 1 k ohm-cm or less, is used as a sputtering target, high-speed film formation becomes possible, and an amorphous transparent conductive thin film with superior transparency in the visible light range, small resistivity, and low internal stress can be manufactured. Furthermore, even in film formation by the inexpensive DC sputtering method equipped with a DC power source without an arcing control function, film formation without generating arcing is possible even if a high DC power is applied. Accordingly, by using the amorphous transparent conductive thin film obtained by using the sputtering target of the present invention, an organic EL element with superior characteristics can be made at a low cost. Therefore the industrial value is very high.

Furthermore, a transparent conductive thin film formed by the sputtering target using the oxide sintered body of the present invention has an internal stress with a low absolute value. Therefore it is possible to deposit on a substrate with a soft surface without deforming the substrate.

A top emission type organic EL with a "substrate/anode/organic luminous layer/cathode (transparent conductive film)" structure is able to emit light in the opposite direction to the substrate. Therefore in the active matrix method using a TFT substrate, it is possible to realize a display with high luminance since it is possible to obtain a large aperture ratio. In this case, it is necessary for the transparent conductive film used as the cathode to be formed on a soft organic luminous layer with inferior heat resistance. If the transparent conductive thin film of the present invention is used, a transparent conductive film with a low resistance, small internal stress absolute value, and high transmittance of visible light can be made at low temperature. Therefore, it is useful as an electrode for the cathode side of a top emission type organic EL.

Furthermore, it is possible to form a transparent electrode with low resistance and superior surface smoothness on a low temperature substrate. Therefore it is possible to form a transparent electrode with high visible light transparency and a low internal stress absolute value, even on a resin film substrate with inferior heat resistance, without deforming the film substrate. The transparent conductive film of the present invention can be used for the anode of a flexible organic EL element with a "film substrate/anode/organic luminous layer/cathode" structure. Furthermore, for the above-mentioned reasons, it is possible to use the transparent conductive film of the present invention for the cathode of a flexible organic EL element. If the transparent conductive film of the present invention is used for the anode and the cathode, it is possible to realize a high performance flexible transparent organic EL display element, and hence the industrial value is very high.

DETAILED DESCRIPTION OF THE INVENTION

The inventors have discovered that an oxide sintered body containing indium, tungsten, and zinc at predetermined atomic number ratios, with a resistivity of 1 k ohm-cm or less, or an oxide sintered body containing indium, tungsten, zinc, and silver at predetermined atomic number ratios, with a resistivity of 1 k ohm-cm or less, when used as a sputtering target, makes high-speed film formation possible, and allows an amorphous transparent conductive thin film with superior transparency in the visible light range, small resistivity, and low internal stress to be manufactured. Furthermore, it was discovered that if the aforementioned sputtering target was used, even in the film formation by the inexpensive DC sputtering method equipped with a DC power source without an arcing control function, arcing does not occur by applying high electrical power, thus arriving at the completion of the present invention.

1. Oxide Sintered Body

An oxide sintered body of the present invention contains indium, tungsten, and zinc, where the tungsten content is in a W/In atomic number ratio of 0.004 to 0.023, the zinc content is in a Zn/In atomic number ratio of 0.004 to 0.100, and the resistivity is 1 k ohm-cm or less. Furthermore, it is preferable to contain indium, tungsten, zinc, and silver, where the tungsten content is in a W/In atomic number ratio of 0.004 to 0.023, the zinc content is in a Zn/In atomic number ratio of 0.004 to 0. 100, the silver content is in an Ag/In atomic number ratio of 0.001 to 0.010, and the resistivity is 1 k ohm-cm or less. The sintered body has indium oxide with a bixbyite type structure as the main phase, and the average crystalline grain size in the crystalline phase is 10 µm or less.

If a transparent conductive thin film is made by the sputtering method using the sputtering target made from the aforementioned oxide sintered body, it is possible to obtain an amorphous and low resistance transparent conductive thin film which has a high crystallization temperature of over 200 degree.C. Furthermore, if the transparent conductive thin film is made by the sputtering method using a sputtering target made from an oxide sintered body to which, as well as indium, tungsten, zinc, and oxygen, has silver added, a transparent conductive thin film with an even smaller resistivity can be obtained, leaving the amorphous nature, optical transparency, and crystallization temperature the same.

Furthermore, by forming the film in appropriate film formation conditions using a sputtering target made from the aforementioned oxide sintered body, it is possible to obtain a transparent conductive thin film with a low internal stress absolute value, a small resistivity, and which is also amorphous.

The reasons for limiting the tungsten, zinc, and silver proportions as mentioned above are as follows.

Tungsten contributes to an improvement in conductivity and an increase in crystallization temperature of the transparent conductive thin film. If the W/In atomic number ratio of the oxide sintered body is less than 0.004, the crystallization temperature of the obtained transparent conductive thin film is not sufficiently raised, and a transparent conductive thin film containing crystalline phases is obtained by sputtering. On the other hand, if the W/In atomic number ratio of the oxide sintered body exceeds 0.023, a transparent conductive thin film with a small resistivity cannot be obtained.

Furthermore, zinc contributes to an improvement in the conductivity, an increase in the crystallization temperature, and a lowering of the internal stress of the transparent conductive thin film. If the Zn/In atomic number ratio of the oxide sintered body is less than 0.004, a transparent conductive thin film with a low internal stress absolute value and a low resistivity cannot be obtained. On the other hand, if the Zn/In atomic number ratio exceeds 0.100, a transparent conductive thin film that has superior transmission characteristics at shorter wavelengths in the visible light range (for example, near a wavelength of 400 nm), cannot be obtained.

Silver contributes to an improvement in the conductivity. If the Ag/In atomic number ratio of the oxide sintered body is less than 0.001, there is no resistance lowering effect in the transparent conductive thin film due to Ag addition, while if the Ag/In atomic number ratio exceeds 0.010, the resistance of the obtained transparent conductive thin film increases.

2. Manufacturing Method for Oxide Sintered Body and Sputtering Target

The oxide sintered body containing indium, tungsten, and zinc of the present invention, is manufactured as follows.

Firstly, $In_2O_3$ powder with an average grain size of 1 μm or less, $WO_3$ powder with an average grain size of 1 μm or less, and ZnO powder with an average grain size of 1 μm or less, is made the raw material powder. The $In_2O_3$ powder, $WO_3$ powder and ZnO powder are blended such that the tungsten is in a W/In atomic number ratio of 0.004 to 0.023, and the zinc is in a Zn/In atomic number ratio of 0.004 to 0.100, and is then added together with water into a plastic pot, and mixed in a wet process ball mill. At this time, it is preferable to use a hard $ZrO_2$ ball to avoid impurity contamination into the slurry as much as possible. A mixing time of 10 to 30 hours is preferable. If the mixing time is shorter than 10 hours, the granulation of the raw material powder becomes insufficient, abnormal grain growth can more easily arise, and a sintered body with a crystalline grain size which exceeds 10 μm is more likely to be obtained. Consequently, there is a situation where sintered body strength decreases, making it difficult to consistently obtain a high-density target. On the other hand, if the mixing time is longer than 30 hours, cohesion between the grains becomes stronger from overgrinding, making it difficult to consistently obtain a high-density target, which is not desirable. After mixing, the slurry is taken out and spray dried using a spray drier, to obtain the granulated powder.

The granulated powder granulated to an average particle size of 20 μm to 150 μm is molded by a cold isostatic press with a pressure of 2 to 5 ton/cm$^2$. It is preferable for the molding press to be a cold isostatic press from the point that a uniform compact can be obtained. If the pressure is less than 2 ton/cm$^2$, the density of the compact does not increase, making it difficult to obtain a high-density target. If it is greater than 5 ton/cm$^2$, it is possible to increase the density of the compact, but tuning of conditions of the process and equipment and the like to obtain such a pressure becomes troublesome, increasing the production cost, so that it is no longer realistic.

Next, the obtained compact is sintered by an annealing process at 1200 to 1500 degree.C. for 10 to 40 hours, in an atmosphere where oxygen is introduced into the atmosphere of the sinter furnace at a rate of 50 to 250 liters/min per 0.1 m$^3$ furnace volume. If the volume of introduced oxygen per 0.1 m$^3$ furnace volume is less than 50 liters/min, the evaporation of tungsten oxide and zinc oxide by thermal dissociation increases, and makes obtaining a high-density sintered body difficult. If it exceeds 250 liters/min, differences in the temperature inside the furnace increases, making stable production of a high-density sintered body difficult. At temperatures lower than 1200 degree.C., it is difficult to stably obtain a high-density sintered body, and in excess of 1500 degree.C., sublimation of the $WO_3$ in the raw material occurs, causing an influence on the composition of the sputtering target, and is thus not desirable. If the annealing processing (sintering) time is shorter than 10 hours, it is difficult to stably obtain a high-density target, and in excess of 40 hours, sublimation of the $WO_3$ in the raw material can occur more easily, and can in some cases cause an influence on the composition of the sputtering target.

At the time of the aforementioned annealing process (sintering), it is preferable that the rise in temperature is performed at approximately 0.5 to 3.0 degree.C./min, and at the time of cooling after sintering by the annealing process, the oxygen introduction is stopped and the temperature is decreased by 0.1 to 1 degree.C/min to 1000 degree.C. Slowing the increase in temperature is necessary to make the temperature distribution inside the furnace uniform. In decreasing the temperature, this is made slower than 1 degree.C./min until 1000 degree.C. to prevent cracking of the target as a result of thermal shock.

The obtained oxide sintered body containing indium, tungsten, and zinc is processed into a desired shape (normally to a thickness of approximately 3 to 10 mm, since it is used as a sputtering target), and the face for sputtering is polished with a cup grinding stone.

When the sputtering target shape is achieved, the resistivity of the sputtering face of the oxide sintered body is measured using a four-pin probe method, and it is confirmed that it is 1 k ohm-cm or less. By making the resistivity 1 k ohm-cm or less, it is possible to realize a fast film formation speed.

A sputtering target is made such that, the oxide sintered body processed as mentioned above is joined to an oxygen-free copper or molybdenum cooling backing plate using an In type brazing filler material with a melting point of 120 to 200 degree.C. At this point, it is also possible to form a metallized film on the bonding face of the sputtering target by sputtering or vapor deposition, in order to improve the wetting with the backing plate, and prevent diffusion of the backing plate material.

Furthermore, under the same conditions as the aforementioned manufacturing conditions, an oxide sintered body containing indium, tungsten, zinc, and silver, and a sputtering target can be made with $In_2O_3$ powder with an average grain size of 1 µm or less, $WO_3$ powder with an average grain size of 1 µm or less, ZnO powder with an average grain size of 1 µm or less, and Ag powder with an average grain size of 1 µm or less, as raw the material powder.

3. Sputtering Target

The film formation speed at the time of DC sputtering depends on the resistivity of the sputtering target. Furthermore, the resistivity of the sputtering target depends on the resistivity of the oxide sintered body which becomes its material. Accordingly, in the case of the oxide sintered body containing indium, tungsten, and zinc, or the oxide sintered body containing indium, tungsten, zinc, and silver of the present invention, in order to realize a fast film formation speed, it is necessary for the resistivity to be 1 k ohm-cm or less, and preferably $1 \times 10^{-1}$ ohm-cm or less. By a reduction process, where the oxide sintered body is heated under a nonoxidizing atmosphere such as nitrogen, it is possible to effectively lower the resistivity of the oxide sintered body, and as a result, the resistivity of the sputtering target.

Furthermore, it is preferable that a tungsten oxide crystalline phase is not present in the sputtering target of the present invention, and the sputtering target comprises only a bixbyite phase. When an oxide sintered body comprising only a bixbyite phase is used as the target, then compared to the case where an oxide sintered body containing indium, tungsten, and zinc with the same resistivity, in which tungsten oxide crystalline phases are detected is used as the target, the result is obtained where the film formation speed at the time of sputtering under the same conditions is clearly faster. This is a result of the sputtering rate of the tungsten oxide crystalline phase being comparatively slower, and if the sputtering target contains a tungsten oxide crystalline phase, the sputtering rate becomes slower in response to the proportion of its presence. This is the same in the oxide sintered body containing indium, tungsten, zinc, and silver.

Here, the bixbyite type structure is crystal structure of the indium oxide ($In_2O_3$), and is also called a C-type rare earth oxide (refer to "Transparent Conductive Film Technology", Ohmsha, pg. 82). The $In_2O_3$ can take a corundum type structure other than the bixbyite type structure. The cations of tungsten, zinc, and silver replace the indium position in the indium oxide in the bixbyite type structure, to form a solid solution. If the sintered body is a single phase solid solution of the bixbyite type structure, a fast film formation speed can be realized for the above-mentioned reasons.

Furthermore, the sputtering target of the present invention has a sintered body density of 6.2 g/cm$^3$ or more, and more preferably, it is desirable for the maximum height Rz of the sputtering face to be 3.0 µm or less. In a sputtering target within these ranges the production amount of nodules (black protrusions on the target surface) is minimal, and problems such as the generation of arcing, and a decrease in the film formation speed do not occur.

Here, the maximum height Rz, which represents the surface roughness, is based on "JIS B 0601-2001". From the roughness profile, the sampling length is extracted in the direction of a mean line, and Rz is the value of the distance between the profile peak line and profile valley line of the extracted part, measured in the longitudinal magnification direction of the roughness profile.

More specifically, Rz is the distance value between the two straight lines that: (1) are parallel to the mean line for the primary profile taken through just the sampling length, (2) come in contact with the primary profile, and (3) are located generally on both sides of the primary profile. The sampling length is a value determined based on JIS standards, and six types of value are determined, according to the value of Rz. For example, when Rz is 0.8 µm to 6.3 µm, the standard length is 0.8 mm, and when Rz is 6.3 µm to 25 µm, the standard length is 2.5 mm. Furthermore, the average line is a line (straight line or curved line) that has the geometric shape of the measured surface on the extracted cross-section curve, and is also a line which is set such that the sum of squares of the deviation from that line to the cross-section curve becomes a minimum. In the present invention, the maximum height Rz is measured at 50 points under these conditions, and the average value is obtained and used.

When the sintered body density of the sputtering target of the present invention becomes low, nodules (black protrusions on the target surface) are produced in the vicinity of the erosion while sputtering is being performed for a long time, and arcing during film formation occurs more easily. If film formation is performed in such a state, a transparent conductive thin film with a small resistivity cannot be obtained. The ease of nodules being produced is related to the sintered body density and the surface roughness of the sputtering surface, and it is known that making the sintered body density 6.2 g/cm$^3$ or more, and more preferably making the maximum height Rz of the sputtering surface 3.0 µm or less, is effective in controlling the nodules and arcing in the case where sputtering is performed for a long time.

When the sintered body density is low (for example 3.5 to 6.1 g/cm$^3$), elements or particles are expelled from the surface as a result of the sputtering, resulting in a state which in outward appearance is as if the surface has been shaved off. At this point in time, holes that were present in the sputtering target come out to the surface, and the holes which have come out to the surface form concave portions at the surface. At the concave portions of the surface, the elements or particles that have been sputtered, adhere and accumulate to the walls of the concave portions, and develop into nodules. Furthermore, if the target surface is rough, it is in a state where the aforementioned concave portions have already formed on the surface. Therefore also in this case, nodules are formed by the same mechanism as mentioned before. The lower the sintered body density, or the larger the surface roughness, the more concave portions are formed, and hence the more nodules are formed. If the nodules develop, plasma concentrates in the electrical discharge, and the generation of arcing and a decrease in the film formation speed begins, leading to a worsening of the film characteristics. The amount of emergence of nodules on the surface of the target, and the accumulated applied electrical power at which the generation of arcing and the decrease in the film formation speed begins, are largely dependent on the sintered body density and surface roughness. That is to say, the higher the sintered body density, and the smaller the surface roughness, the smaller the amount of emergence of nodules, and the larger the accumulated applied electrical power at which the generation of arcing and the decrease in the film formation speed begins.

For this purpose, in the manufacture of the oxide sintered body, as mentioned before, as well as undertaking densification of the oxide sintered body, a cup grinding stone (for example, manufactured by Nitolex Corporation, #140) is used to make the maximum height Rz of the sputtering face 3.0 µm or less by grinding.

Furthermore, it is preferable for the sputtering target containing indium, tungsten, and zinc of the present invention, and the sputtering target containing indium, tungsten, zinc, and silver of the present invention to have a crystalline grain size mean value of 10 μm or less. If a sputtering target with a crystalline grain size mean value of 10 μm or less is used, it can be used for manufacture until it is completely used up. Therefore, as mentioned before, the oxide sintered body is manufactured so that the crystalline grain size mean value becomes 10 μm or less. If the crystalline grain size mean value exceeds 10 μm, the strength of the sputtering target becomes inferior, and cracking and the like is more easily generated in sputtering at high electrical power input. If cracks occur in the sputtering target, nodules are more easily produced at the edge of the cracks, and plasma is concentrated at the nodules when discharging electricity, so that the generation of arcing and a decrease in film formation speed begins, leading to a worsening of the film characteristics.

4. Transparent Conductive Thin Film

As a result of the sputtering target of the present invention, an amorphous transparent conductive thin film can be manufactured by the sputtering method or ion plating method, having the characteristics of a small resistivity of $9\times10^{-4}$ ohm-cm or less, a low film internal stress absolute value of $1.0\times10^{10}$ dyn/cm$^2$ or less, and a superior transmittance in the visible light range, particularly on the short wavelength side (near 400 nm).

Here, when a compressive stress is generated such that the film is compressed and shrunk in the in-plane direction, the internal stress takes a negative value, while when a tensile stress is generated which pulls the film in the in-plane direction, the internal stress takes a positive value.

The manufacturing method for the transparent conductive thin film preferably uses the sputtering target of the present invention, and the film formation is performed with a target-substrate distance at the time of sputtering of 80 to 150 mm, and under a sputtering gas pressure of 0.8 to 1.5 Pa.

If the target-substrate distance becomes shorter than 80 mm, the kinetic energy of the sputter particles which accumulate at the substrate becomes high, and only a transparent conductive thin film with a high film internal stress is obtained, while if the target-substrate distance becomes longer than 150 mm, the kinetic energy of the sputter particles which accumulate at the substrate becomes too low, so that compaction due to diffusion on the substrate does not occur, and only a transparent conductive thin film with a low density is obtained, which is not desirable.

Furthermore, if the sputtering gas pressure becomes lower than 0.8 Pa, the kinetic energy of the sputter particles which accumulate at the substrate becomes high, and only a transparent conductive thin film with a high film internal stress is obtained, while if the sputtering gas pressure becomes higher than 1.5 Pa, the kinetic energy of the sputter particles which accumulate at the substrate becomes too low, so that compaction due to diffusion on the substrate does not occur, and only a transparent conductive thin film with a low density is obtained, which is not desirable.

As the sputtering gas, pure Ar gas is introduced. To further lower the resistivity of the transparent conductive thin film, O$_2$ gas is mixed in the range of 0 to 15 vol %. The resistivity of the obtained transparent conductive thin film depends on the amount of mixed O$_2$ gas. As the amount of mixed O$_2$ gas is increased from zero, a decreasing trend in resistivity is shown, and at a predetermined amount of mixed O$_2$ gas, a minimum resistivity value (ρmin) of the transparent conductive thin film is shown. Then, as the amount of mixed O$_2$ gas is further increased, an increasing trend in the resistivity of the transparent conductive thin film from the minimum value is shown. Accordingly, by specifying the range amount of mixed O$_2$ gas, so that the resistivity of the transparent conductive thin film will become in the vicinity of the minimum value (ρmin), the resistivity of the obtained transparent conductive thin film can be lowered as much as possible.

As mentioned above, it has also been confirmed that a transparent conductive thin film which has a composition of indium oxide as the principal ingredient, with tungsten contained at a W/In atomic number ratio of 0.004 to 0.023, and zinc contained at a Zn/In atomic number ratio of 0.004 to 0.100, or a transparent conductive thin film which has indium oxide as the principal ingredient, with tungsten contained at a W/In atomic number ratio of 0.004 to 0.023, zinc contained at a Zn/In atomic number ratio of 0.004 to 0.100, and silver contained at an Ag/In atomic number ratio of 0.001 to 0.010, has a completely amorphous structure, and therefore not only has a smooth surface, but also shows a resistivity of $9\times10^{-4}$ ohm-cm or less, and further because it has a high crystallization temperature exceeding 200 degree.C., heating below 200 degree.C. does not change those characteristics.

The transparent conductive thin film of the present invention is of an amorphous structure. However even if there are minute crystals of a size and number to a degree that the crystalline phase cannot be detected by X-ray diffraction, the same effect can be obtained, and this range is also included in the present invention.

Since the transparent conductive thin film of the present invention has the aforementioned characteristics, it is useful for transparent electrodes in display devices, and in particular, is suitable for application to transparent electrodes such as in organic EL elements, inorganic EL elements, liquid crystal elements, touch panels, and the like.

As explained in detail above, according to the present invention, it is possible to obtain an amorphous film with a superior surface smoothness, superior transmission characteristics in the visible light range, particularly in the short wavelength range (near 400 nm), and a small resistivity ($9.0\times10^{-4}$ ohm-cm or less), in a state where the internal stress absolute value is small ($1.0\times10^{10}$ dyn/cm$^2$ or less).

Since the obtained transparent conductive thin film has a low internal stress absolute value, it is possible to deposit on a substrate with a soft surface without deforming the substrate. In particular, it is possible to form a transparent conductive thin film as a cathode on a soft organic luminous layer. Therefore, it is useful in realizing a top-emission type organic EL element where it is possible to efficiently take out light from the cathode, which is an upper surface electrode. A top-emission type organic EL element can be used as a cathode in a high-aperture-ratio organic EL element, which is formed on a glass substrate with a TFT (thin-film transistor) formed on top. Furthermore, since a transparent electrode with a small resistivity and a superior surface smoothness can be formed on a low-temperature substrate, the transparent conductive thin film of the present invention can be formed as a low temperature, low resistance transparent electrode on a soft resin film substrate having no heat resistance, without deforming the substrate. Accordingly, the transparent conductive thin film of the present invention can be used as a cathode and/or anode in a flexible transparent organic EL element using a resin film substrate.

The transparent conductive thin film of the present invention has a crystallization temperature of 200 degree.C. or more, and even with respect to heating below 200 degree.C., it has an amorphous nature and surface smoothness, and has a characteristic that the resistivity property does not worsen. Therefore it is easy to manufacture an amorphous film stably even in the sputtering method where the substrate is susceptible to receiving heat from plasma. Furthermore, it has a characteristic where, in the manufacturing process after the film has been fixed, even if this contains a heating process of below 200 degree.C., the characteristics are stable.

The transparent conductive thin film of the present invention can be used as a transparent electrode not only for organic EL elements, but also for inorganic EL elements, LCDs, electronic paper and touch panels. Therefore it can be said that the industrial value is very high. Furthermore, an organic EL element using the transparent conductive thin film of the present invention has a strong emission intensity, and is not susceptible to dark spots. Therefore it becomes possible to manufacture high-quality displays, and the industrial value is very high.

EXAMPLES

1. Resistivity and Film Formation Speed of Oxide Sintered Body

Examples 1 to 8

$In_2O_3$ powder with an average grain size of 1 μm or less, $WO_3$ powder with an average grain size of 1 μm or less, and ZnO powder with an average grain size of 1 μm or less, was made the raw material powder. The $In_2O_3$ powder, $WO_3$ powder, and ZnO powder was blended such that the tungsten was in a W/In atomic number ratio of 0.004 to 0.023, and the zinc content was in a Zn/In atomic number ratio of 0.004 to 0.100, and was added together with water into a plastic pot, and mixed in a wet process ball mill. At this time, a hard $ZrO_2$ ball was used, and the mixing time was made 18 hours. After mixing, the slurry was taken out, filtered, dried and granulated. The obtained granulated powder was molded using a cold isostatic press with a pressure of 3 ton/cm$^2$.

Next, the obtained compact was sintered in the following way. Sintering was performed at 1450 degree.C. for 20 hours in an atmosphere where oxygen was introduced into the atmosphere of the sinter furnace at a rate of 100 liters/min per 0.1 m$^3$ furnace volume. At this time, the temperature was increased at 1 degree.C./min, and at the time of cooling after sintering, the oxygen introduction was stopped, and the temperature was decreased to 1000 degree.C. at 1 degree.C./min.

Furthermore, under the same conditions, an oxide sintered body containing indium, tungsten, zinc, and silver was made with $In_2O_3$ powder with an average grain size of 1 μm or less, $WO_3$ powder with an average grain size of 1 μm or less, ZnO powder with an average grain size of 1 μm or less, and Ag powder with an average grain size of 1 μm or less, as the raw material powder.

The sintered body density of the obtained oxide sintered body was measured by the Archimedes method using water, and was 6.8 to 7.0 g/cm$^3$.

Fragments of the obtained oxide sintered body were pulverized, then powder X-ray diffraction measurement was performed in an X-ray diffraction device (manufactured by Mac Science Co., M18XHF$^{22}$), where only the diffraction peaks attributable to the indium oxide crystalline phase of a bixbyite type structure were observed. From local analysis by EPMA, it was found that crystalline phases of tungsten oxide such as $WO_2$ and $WO_3$ were not present, and furthermore, the indium oxide crystalline phases had tungsten and zinc in a solid solution, confirming that it was the oxide sintered body of the present invention.

An oxide sintered body containing indium, tungsten, and zinc, and an oxide sintered body containing indium, tungsten, zinc, and silver were processed into a size of diameter 152 mm, and thickness 5 mm, and the sputtering face was polished using a cup grinding stone (manufactured by Nitolex Corporation, #140). The maximum height Rz measured by a contact surface roughness gage (manufactured by Tokyo Seimitsu Co., Ltd., SURFCOM E-MD-S75A), was 3.0 μm or less for all cases. Furthermore, with respect to the sputtering face of the oxide sintered body, the surface resistance was measured using a four-pin probe method resistivity meter Loresta EP (manufactured by Dia Instruments Co., Ltd., MCP-T360 model), and the sintered body thickness was measured. Then upon calculation, the resistivity was 0.3 k ohm-cm to 1.0 k ohm-cm. Therefore it was determined as the oxide sintered body of the present invention. The processed oxide sintered body was bonded to an oxygen-free copper backing plate using metallic indium.

The sputtering target was attached to a cathode for non-magnetic targets of a direct-current magnetron sputtering apparatus (manufactured by Tokki Corporation, SPF503K) having a direct-current power supply with no arcing control function, and a glass substrate was placed in a position such that it faced the sputtering target. A part of the glass substrate directly above the center of the sputtering target was marked with permanent ink. Then, the target-substrate distance was made to be 80 mm, and pure Ar gas was introduced, with just 2 vol % of $O_2$ gas mixed. The gas pressure was made to be 0.8 Pa. Then direct-current plasma was generated at a direct-current of 160 W, and sputtering was performed for 30 minutes with the substrate fixed facing the sputtering target, and with no heating of the substrate.

After film formation, the marked permanent ink and the film that was deposited above it were removed using acetone, and the difference in level caused by the removal of the permanent ink, that is to say, the film thickness, was measured using a contact surface profile measuring instrument (Dektak$^3$ST). The film formation speed was calculated from the film thickness divided by the film formation time.

Furthermore, in order to check the electrical characteristics and optical characteristics of the transparent conductive thin film, a transparent conductive thin film with a film thickness of about 150 nm was manufactured in compliance with a determined film formation speed, without marking with permanent ink, and with no heating of the substrate, by the same method as mentioned above. The surface resistance of the transparent conductive thin film was measured by the four-pin probe measurement method to calculate the resistivity, and the light transmittance including the substrate was measured using a spectrophotometer (manufactured by Hitachi Ltd., U-4000). The maximum height Rz of the transparent conductive thin film was measured using an atomic force microscope (manufactured by Digital Instruments Co., NS-III, D5000 System). The internal stress of the transparent conductive thin film was evaluated by measuring the change in warpage of a quartz substrate (50 mm×10 mm×0.1 mm) with a thin film material evaluation system (manufactured by NEC San-ei Instruments, Ltd., MH4000) with respect to a transparent conductive thin film made under the same film formation conditions on the quartz substrate.

The result gave a transparent conductive thin film with excellent light transmittance in the visible light range, and which was amorphous, with low resistivity, with an internal stress absolute value of the transparent conductive thin film of $1.0 \times 10^{10}$ dyn/cm$^2$ or less, and with all resistivities of $9 \times 10^{-4}$ ohm-cm or less.

In Table 1, the measurement results for the composition, resistivity, and film formation speed of the oxide sintered body are shown.

TABLE 1

| | Characteristics of Oxide Sintered Body | | | | Film Formation |
|---|---|---|---|---|---|
| | W/In A-N-R | Zn/In A-N-R | Ag/In A-N-R | Resistivity (ohm-cm) | Speed (nm/min) |
| Example 1 | 0.004 | 0.005 | — | 0.3 k | 49 |
| Example 2 | 0.007 | 0.020 | — | 0.5 k | 52 |
| Example 3 | 0.007 | 0.054 | — | 1.0 k | 50 |
| Example 4 | 0.007 | 0.095 | — | 0.7 k | 51 |
| Example 5 | 0.012 | 0.054 | — | 0.5 k | 51 |
| Example 6 | 0.023 | 0.054 | — | 0.5 k | 50 |
| Example 7 | 0.007 | 0.055 | 0.004 | 0.7 k | 48 |
| Example 8 | 0.007 | 0.095 | 0.010 | 0.7 k | 50 |

(A-N-R = Atomic Number Ratio)

Comparative Examples 1 to 8

Oxidized sintered bodies containing indium, tungsten, and zinc were manufactured under the same conditions as example 1 except that WO$_3$ powder having a mean particle diameter of 3 to 5 μm, and ZnO powder having a mean particle diameter of 3 to 5 μm were used, and the mixing time of the raw material powder by the wet process ball mill was shortened to 5 hours. The sintered body density of the obtained sintered bodies was 6.8 to 6.9 g/cm$^3$.

From powder X-ray diffraction measurement, and from a scanning electron microscope (manufactured by Hitachi, Ltd., S-800) and an EPMA (manufactured by Shimadzu Corporation, EPMA-2300), it was found that the obtained oxidized sintered bodies contained WO$_3$ crystalline phases. Moreover, the resistivity of the obtained oxidized sintered bodies was a high resistivity of 11 k to 39 k ohm-cm. This confirmed that they were different oxidized sintered bodies to those of the present invention.

The oxidized sintered bodies were ground using the same method as example 1, and bonded onto an oxygen-free copper backing plate. Sputtering film formation was performed, and the film formation speed, film resistivity, and optical characteristics were measured. Table 2 shows the measurement results of the composition and resistivity values of the oxidized sintered bodies, and the film formation speed in sputtering when using sputtering targets manufactured from these oxidized sintered bodies.

If Table 1 and Table 2 are compared, in the case of either composition, it is found that the lower the resistivity of the oxide sintered body, the higher the film formation speed of sputtering, and by making the resistivity of the oxide sintered body 1 k ohm-cm or less, high-speed film formation becomes possible. Therefore the usefulness of a sputtering target using the oxide sintered body of the present invention is confirmed.

TABLE 2

| | Characteristics of Oxide Sintered Body | | | | Film Formation |
|---|---|---|---|---|---|
| | W/In A-N-R | Zn/In A-N-R | Ag/In A-N-R | Resistivity (ohm-cm) | Speed (nm/min) |
| C-Example 1 | 0.004 | 0.005 | — | 15 k | 35 |
| C-Example 2 | 0.007 | 0.020 | — | 17 k | 37 |
| C-Example 3 | 0.007 | 0.054 | — | 21 k | 35 |
| C-Example 4 | 0.007 | 0.095 | — | 30 k | 39 |
| C-Example 5 | 0.012 | 0.054 | — | 25 k | 40 |
| C-Example 6 | 0.023 | 0.054 | — | 26 k | 35 |
| C-Example 7 | 0.007 | 0.055 | 0.004 | 25 k | 38 |
| C-Example 8 | 0.007 | 0.095 | 0.010 | 23 k | 38 |

(C-Example = Comparative Example, A-N-R = Atomic Number Ratio)

<Characteristics of the Obtained Thin-Film>

Transparent conductive thin films obtained from sputtering targets made from the oxidized sintered bodies of examples 1 to 8 were transparent conductive thin films that were amorphous, had a low resistivity of $4.8 \times 10^{-4}$ to $9 \times 10^{-4}$ ohm-cm, and an excellent light transmittance in the visible light range.

The internal stress of the film was dependent on the sputtering gas pressure and the target-substrate distance. By sputtering film formation at a sputtering gas pressure of 0.8 to 1.5 Pa, and a target-substrate distance of 80 mm to 150 mm, with a suitable amount of oxygen introduced, an amorphous transparent conductive thin film which had a low film internal stress absolute value of $1.0 \times 10^{10}$ dyn/cm$^2$ or less, and excellent conductive and optical properties was obtained.

The amorphous transparent conductive thin film of the present invention can be used as transparent electrodes formed on organic luminous layers in top emission type organic EL elements, and as transparent electrodes formed on resin film substrates. Furthermore, the transparent conductive thin film of the present invention had outstanding transparency on the short wavelength side (wavelength 400 nm) of the visible light range. Also the obtained transparent conductive thin film maintained its amorphous nature even while heating to 200 degree.C. in nitrogen, and the conductivity did not worsen. Accordingly, it is suggested that amorphous films can be obtained stably even in sputtering methods where the substrate is susceptible to receiving heat from plasma. Furthermore, it is said to be a material with stable characteristics, even if a manufacturing process after film fixing includes a 200 degree.C. heating process.

Accordingly, compared to an organic EL element using a conventional transparent conductive thin film, an organic EL element using the transparent conductive thin film of the present invention has a stronger emission brightness, and a longer emission intensity half-life. Furthermore, a high-quality organic EL element, which is not susceptible to the occurrence of dark spots (non-luminous parts), can be provided.

Other than the oxide sintered body compositions shown in Table 1 and Table 2, oxidized sintered bodies of compositions (W/In atomic number ratio, Zn/In atomic number ratio, Ag/In atomic number ratio)=(0.005, 0.010, 0), (0.012, 0.005, 0), (0.011, 0.015, 0), (0.012, 0.098, 0), (0.023, 0.095, 0), (0.006, 0.053, 0.008), (0.008, 0.096, 0.008) were used and the same measurements were performed. The obtained transparent conductive thin films were amorphous, had low resistivity, had an excellent light transmittance in the visible light range, and the trend relating to film formation speed was exactly the same.

2. Reduction Process and Resistivity

Examples 9 to 30

Next, the oxide sintered body made in examples 1 to 8 were heated in a vacuum with an atmospheric pressure of $1\times10^{-1}$ Pa or less, and a reduction process was applied to control the resistivity. By making an annealing process temperature 700 degree.C., and setting an annealing time varying in the range of 1 to 10 hours, oxidized sintered bodies with various resistivities were obtained. The annealing time for examples 9 to 16 was 1 hour. The annealing time for examples 17 to 24 was 2 hours. The annealing time for examples 25 to 32 was 10 hours.

It was confirmed by powder X-ray diffraction measurements that the crystalline phases constituting the oxide sintered body did not change before and after annealing.

After annealing processing, the sputtering target was made by the same method as for examples 1 to 8, by grinding, and bonding to an oxygen-free copper backing plate. Using the obtained sputtering target, DC sputtering was performed under the same conditions as examples 1 to 8, and the film formation speed was measured. The measurement results are shown in Table 3.

TABLE 3

| | Characteristics of Oxide Sintered Body | | | Film Formation |
|---|---|---|---|---|---|
| | W/In A-N-R | Zn/In A-N-R | Ag/In A-N-R | Resistivity (ohm-cm) | Speed (nm/min) |
| Example 9 | 0.004 | 0.005 | — | $3 \times 10^{-1}$ | 52 |
| Example 10 | 0.007 | 0.020 | — | $5 \times 10^{-1}$ | 56 |
| Example 11 | 0.007 | 0.054 | — | $5 \times 10^{-1}$ | 53 |
| Example 12 | 0.007 | 0.095 | — | $4 \times 10^{-1}$ | 53 |
| Example 13 | 0.012 | 0.054 | — | $8 \times 10^{-1}$ | 51 |
| Example 14 | 0.023 | 0.054 | — | $4 \times 10^{-1}$ | 52 |
| Example 15 | 0.007 | 0.055 | 0.004 | $5 \times 10^{-1}$ | 53 |
| Example 16 | 0.007 | 0.095 | 0.010 | $6 \times 10^{-1}$ | 55 |
| Example 17 | 0.004 | 0.005 | — | $3 \times 10^{-2}$ | 61 |
| Example 18 | 0.007 | 0.020 | — | $6 \times 10^{-2}$ | 63 |
| Example 19 | 0.007 | 0.054 | — | $6 \times 10^{-2}$ | 62 |
| Example 20 | 0.007 | 0.095 | — | $4 \times 10^{-2}$ | 61 |
| Example 21 | 0.012 | 0.054 | — | $6 \times 10^{-2}$ | 62 |
| Example 22 | 0.023 | 0.054 | — | $7 \times 10^{-2}$ | 61 |
| Example 23 | 0.007 | 0.055 | 0.004 | $5 \times 10^{-2}$ | 62 |
| Example 24 | 0.007 | 0.095 | 0.010 | $7 \times 10^{-2}$ | 61 |
| Example 25 | 0.004 | 0.005 | — | $6 \times 10^{-3}$ | 65 |
| Example 26 | 0.007 | 0.020 | — | $8 \times 10^{-3}$ | 67 |
| Example 27 | 0.007 | 0.054 | — | $2 \times 10^{-3}$ | 69 |
| Example 28 | 0.007 | 0.095 | — | $4 \times 10^{-3}$ | 66 |
| Example 29 | 0.012 | 0.054 | — | $5 \times 10^{-3}$ | 68 |
| Example 30 | 0.023 | 0.054 | — | $3 \times 10^{-3}$ | 66 |
| Example 31 | 0.007 | 0.055 | 0.004 | $3 \times 10^{-3}$ | 68 |
| Example 32 | 0.007 | 0.095 | 0.010 | $6 \times 10^{-3}$ | 66 |

(A-N-R = Atomic Number Ratio)

From Table 3, it can be seen that by the annealing processing, it is possible to control to further lower the resistivity of the oxide sintered body. As a result, the lower the resistivity of the oxide sintered body, the higher the film formation speed. In particular, it has been found as in examples 17 to 32, that by making the resistivity of the oxide sintered body $1\times10^{-1}$ ohm-cm or less, high-speed film formation of 60 nm/min or more is possible.

<Characteristics of the Obtained Transparent Conductive Thin Films>

The transparent conductive thin films obtained in examples 9 to 32 were transparent conductive thin films that were amorphous, had a low resistivity of $4.5\times10^{-4}$ to $9\times10^{-4}$ ohm-cm, and an excellent light transmittance in the visible light range.

The internal stress of the transparent conductive thin film was dependent on the sputtering gas pressure and the target-substrate distance. By sputtering film formation at a sputtering gas pressure of 0.8 to 1.5 Pa, a target-substrate distance of 80 mm to 150 mm, with a suitable amount of oxygen introduced, an amorphous transparent conductive thin film which had a low film internal stress absolute value of $1.0\times10^{10}$ dyn/cm$^2$ or less, and excellent conductive and optical properties was obtained.

The amorphous transparent conductive thin film of the present invention can be used as transparent electrodes formed on organic luminous layers in top emission type organic EL elements, and as transparent electrodes formed on resin film substrates. Furthermore, the transparent conductive thin film of the present invention had outstanding transparency on the short wavelength side (wavelength 400 nm) of the visible light range. Also the obtained transparent conductive thin film maintained its amorphous nature even while heating to 200 degree.C. in nitrogen, and the conductivity did not worsen. Accordingly, it is suggested that amorphous films can be obtained stably even in sputtering methods where the substrate is susceptible to receiving heat from plasma. Furthermore, it is said to be a material with stable characteristics, even if a manufacturing process after film fixing includes a 200 degree.C. heating process.

Accordingly, compared to an organic EL element using a conventional transparent conductive thin film, an organic EL element using the transparent conductive thin film of the present invention has a stronger emission brightness, and a longer emission intensity half-life. Furthermore, a high-quality organic EL element, which is not susceptible to the occurrence of dark spots (non-luminous parts), can be provided.

Other than the oxide sintered body compositions shown in Table 3, oxidized sintered bodies of compositions (W/In atomic number ratio, Zn/In atomic number ratio, Ag/In atomic number ratio)=(0.005, 0.010, 0), (0.012, 0.005, 0), (0.011, 0.015, 0), (0.012, 0.098, 0), (0.023, 0.095, 0), (0.006, 0.053, 0.008), (0.008, 0.096, 0.008) were used and the same measurements were performed, and similar transparent conductive thin films were obtained, and the trend relating to film formation speed was exactly the same.

If a tungsten oxide crystalline phase is contained in the oxide sintered body, resistance lowering can be performed by the same reduction process. However compared to a case where tungsten oxide phases are not contained, there was a trend seen where the resistance lowering effect was smaller. Accordingly, to perform effective resistance lowering by the reduction process, it is preferable for the oxide sintered body to be only in the bixbyite type structure.

4. Amount of Oxygen Mixed in Sputtering Gas

Examples 33 to 48, Comparative Example 9

Next, the relationship between the resistivity of the transparent conductive thin film, and the resistivity of the sputtering target was investigated for when the amount of mixed oxygen in the sputtering gas was changed at the time of sputtering. The sputtering targets obtained in example 3 (target resistivity 1.0 k ohm-cm), example 11 (target resistivity $5\times10^{-1}$ ohm-cm), example 19 (target resistivity $6\times10^{-2}$ ohm-cm), example 27 (target resistivity $2\times10^{-3}$ ohm-cm), and comparative example 3 (target resistivity 21 k ohm-cm), were attached to the cathode for nonmagnetic targets of a direct-current magnetron sputtering apparatus, and a glass substrate was placed in a position such that it faced the sputtering target.

The target-substrate distance was made to be 80 mm, and pure Ar gas was introduced, with an $O_2$ gas mixture in a range of 0 to 15 vol %. The gas pressure was made to be 0.8 Pa. Then direct-current plasma was generated at a direct-current of 300 W, and sputtering was performed for 10 minutes with the substrate fixed facing the sputtering target, and heating of the substrate to 300 degree.C. The amount of mixed $O_2$ gas was altered at 0.5 vol % intervals in the range of 0 to 15 vol %, and a transparent conductive thin film was manufactured on the substrate. The dependency of the resistivity of the transparent conductive thin film on the amount of mixed $O_2$ gas was investigated.

The resistivity of the obtained transparent conductive thin film was dependent on the amount of mixed $O_2$ gas. As the amount of mixed $O_2$ gas was increased from zero, a decreasing trend in resistivity was shown, and at a predetermined amount of mixed $O_2$ gas, a minimum resistivity value ($\rho$min) of the transparent conductive thin film was shown. Then as the amount of mixed $O_2$ gas was further increased, an increasing trend in the resistivity of the transparent conductive thin film from the minimum value was shown. The minimum resistivity value ($\rho$min) of the transparent conductive thin film and the amount of mixed $O_2$ gas at that point, and the amount of mixed $O_2$ gas at which a resistivity which settles within a range of 10% from the minimum resistivity value (that is to say, 1.1 $\rho$min) can be obtained, was then measured.

The measurement results are shown in Table 4.

TABLE 4

|  | Resistivity of Target (ohm-cm) | Minimum Resistivity Value($\rho$min) of Film (ohm-cm) | Range of $O_2$ gas mixed quantity where Resistivity of Film is 1.1 $\rho$min or less (vol %) |
| --- | --- | --- | --- |
| Example 33 | 1.0 k | $5.1 \times 10^{-4}$ | 4~6 |
| Example 34 | $5 \times 10^{-1}$ | $4.9 \times 10^{-4}$ | 5~8 |
| Example 35 | $6 \times 10^{-2}$ | $4.8 \times 10^{-4}$ | 6~40 |
| Example 36 | $2 \times 10^{-3}$ | $4.8 \times 10^{-4}$ | 6~11 |
| C-Example 9 | 21 k | $5.3 \times 10^{-4}$ | 3~5 |

(C-Example = Comparative Example)

<Characteristics of the Obtained Thin-Film>

As shown in Table 4, the resistivity of the obtained transparent conductive thin film is dependent on the resistivity of the sputtering target, and the lower the resistivity of the sputtering target within the scope of the present invention, the lower the resistivity of the obtained transparent conductive thin film. Furthermore, the range of the amount of mixed oxygen in the sputtering gas in which a transparent conductive thin film with a low resistivity is obtained, becomes wider as the resistivity of the oxide sintered body becomes lower within the scope of the present invention. Therefore it is seen that a low-resistance film can be obtained with excellent reproducibility, which is convenient from the aspect of productivity.

Oxidized sintered bodies with compositions as in examples 1, 2, and 4 to 8, and compositions of (W/In atomic number ratio, Zn/In atomic number ratio, Ag/In atomic number ratio)=(0.005, 0.010, 0), (0.012, 0.005, 0), (0.011, 0.015, 0), (0.012, 0.098, 0), (0.023, 0.095, 0), (0.006, 0.053, 0.008), (0.008, 0.096, 0.008) were used and the same measurements were performed. The same trends were seen, in that the lower the resistivity of the oxide sintered body, the lower the resistivity of the transparent conductive thin film, and the wider the range of the amount of mixed oxygen at which a low-resistance transparent conductive thin film could be obtained.

5. Relationship between Sintered Body Density, and Arcing and Nodules

Examples 37 to 40, Comparative Examples 10 to 13

In the manufacturing conditions of example 3, the sintering time at 1450 degree.C. was varied between 1 to 20 hours, and oxidized sintered bodies of various sintered body densities were made. Oxidized sintered bodies with a W/In atomic number ratio of 0.007, a Zn/In atomic number ratio of 0.054, and a sintered body density of 5.2 to 7.0 g/cm$^3$ (by the Archimedes method using water) were manufactured. From scanning electron microscope observations of broken-out sections of the oxidized sintered bodies, the average value of 100 crystalline grain sizes amongst the oxidized sintered bodies was obtained, and it was found that all of them were 7 to 9 μm.

A sputtering target was attached to a cathode for nonmagnetic targets of a direct-current magnetron sputtering apparatus, the target-substrate distance was made to be 80 mm, and Ar gas with a purity of 99.9999 atomic weight % was introduced, with just 5 vol % of $O_2$ gas mixed. The gas pressure was made to be 0.8 Pa. Direct-current plasma was generated and the direct-current power was made to vary at 50 W intervals in a range of 100 W to 800 W, and film formation was performed for 1 hour at each power level, and the direct-current power at which cracks started to occur in the sputtering target was obtained.

TABLE 5

|  | Sintering time (hour) | Sintered body density (g/cm$^3$) | Input power at which cracks occur |
| --- | --- | --- | --- |
| Example 37 | 35 | 7.0 | cracks are not generated even at 800 w |
| Example 38 | 25 | 6.8 | cracks are not generated even at 800 w |
| Example 39 | 15 | 6.4 | cracks are not generated even at 800 w |
| Example 40 | 10 | 6.2 | cracks are not generated even at 800 w |
| C-Example 10 | 5 | 6.0 | cracks are generated at 450 w |
| C-Example 11 | 3 | 5.8 | cracks are generated at 450 w |
| C-Example 12 | 2 | 5.5 | cracks are generated at 400 w |
| C-Example 13 | 1 | 5.2 | cracks are generated at 350 w |

(C-Example = Comparative Example)

As shown in Table 5, if the sintered body density of the sputtering target is 6.2 g/cm$^3$ or more, even with input of direct-current power of 800 W, cracks are not generated, and film formation was performed stably. If a sputtering target with generated cracks is used as is, production of nodules in the cracked portions could be seen, and furthermore, a decrease in the film formation speed, generation of arcing, and an increase in the film resistivity could be seen. Such a sputtering target cannot be used in manufacturing a transparent conductive thin film. To increase the productivity of transparent conductive thin films, it is necessary to apply as high an electrical power as possible, and to manufacture at a high film formation speed. However even under these conditions, for a usable sputtering target, it is said to be necessary for the sintered body density to be 6.2 g/cm³ or more.

Table 5 is a result of measurements for a sputtering target where the W/In atomic number ratio was 0.007, and the Zn/In atomic number ratio was 0.054. When the oxidized sintered bodies with the compositions of examples 1, 2, and 4 to 8, and compositions of (W/In atomic number ratio, Zn/In atomic number ratio, Ag/In atomic number ratio)= (0.005, 0.010, 0), (0.012, 0.005, 0), (0.011, 0.015, 0), (0.012, 0.098, 0), (0.023, 0.095, 0), (0.006, 0.053, 0.008), (0.008, 0.096, 0.008) were used, exactly the same results were obtained. It was thus found that the sintered body density of the sputtering target as determined in the present invention is an important item.

6. Relationship between Surface Roughness of the Sputtering Surface, and Arcing and Nodules Examples 41 to 45, Comparative Examples 14 and 15

A sputtering target with a W/In atomic number ratio of 0.007, a Zn/In atomic number ratio of 0.054, and a sintered body density of 6.8 to 7.0 g/cm³ (by the Archimedes method using water), was manufactured under the same manufacturing conditions as example 3. In making the sputtering target, the type of cup grinding stone used in the grinding process of the sputtering face was changed, and the maximum height Rz of the sputtering surface was changed. The maximum height Rz is a value determined based on the aforementioned JIS standards, and the average measured value of measurements at 50 points on the sputtering surface was employed.

Examples 46 to 49, Comparative Examples 16 and 17

In the manufacturing conditions as in example 3, the sintering time at 1450 degree.C. was shortened to 10 hours, and a sputtering target with a W/In atomic number ratio of 0.007, a Zn/In atomic number ratio of 0.054 and a sintered body density of 6.2 to 6.6 g/cm³ (by the Archimedes method using water) was manufactured. In making the sputtering target, the type of cup grinding stone used in the grinding process of the sputtering face of the obtained sputtering target was changed, and the maximum height Rz of the sputtering surface was changed. The maximum height Rz is a value determined based on the aforementioned JIS standards, and the average measured value of measurements at 50 points on the sputtering surface was employed.

The aforementioned sputtering target was attached to a cathode for non-magnetic targets of a direct-current magnetron sputtering apparatus. In order to generate direct-current plasma, and to measure the accumulated input electrical power from the start of the continuous sputtering to the start of arcing generation, and the deepest depth of the erosion (the distance from the opposite face of the sputtering face) at the start of arcing generation, the target-substrate distance was made to be 80 mm, Ar gas with a purity of 99.9999 atomic weight % was introduced, with just 5 vol % of $O_2$ gas mixed, the gas pressure was made 0.8 Pa, and sputtering was performed at a direct-current of 500 W, and the generation status of the arcing was observed. In this case, for the DC power source, a normal DC power source which was not fitted with an arcing control function was used. Furthermore, at the start and end of film formation, (1) the film formation speed, (2) the resistivity of the transparent conductive thin film, and (3) the transmittance characteristics (wavelength: 400 nm) of the transparent conductive thin film were measured.

TABLE 6

|  | Density (g/cm³) | Rz (μm) | Accumulated applied power to Arcing generation (kWh) | Deepest depth of erosion (mm) |
|---|---|---|---|---|
| Example 41 | 7.0 | 1.6 | arcing was not generated until the erosion deepest depth become 1 mm | 1 |
| Example 42 | 6.8 | 2.8 | same as the above | 1 |
| Example 43 | 6.9 | 3.0 | same as the above | 1 |
| Example 44 | 6.8 | 2.6 | same as the above | 1 |
| Example 45 | 6.8 | 3.0 | same as the above | 1 |
| C-Example 14 | 6.8 | 3.2 | 17 | 2.2 |
| C-Example 15 | 6.8 | 4.0 | 15 | 3.1 |
| Example 46 | 6.2 | 2.0 | arcing was not generated until the erosion deepest depth become 1 mm | 1 |
| Example 47 | 6.2 | 2.3 | same as the above | 1 |
| Example 48 | 6.0 | 2.8 | same as the above | 1 |
| Example 49 | 6.0 | 3.0 | same as the above | 1 |
| C-Example 16 | 6.2 | 3.2 | 13 | 2.9 |
| C-Example 17 | 6.2 | 3.8 | 13 | 3.5 |

(C-Example = Comparative Example)

<Film Formation Speed, and Characteristics of the Obtained Film>

As shown in Table 6, arcing was not generated and nodules were not produced on the surface of the sputtering targets as in examples 41 to 49, even when the accumulated applied electrical power was increased, and at the finishing point of continuous sputtering. As a result, the used sputtering targets could be completely used up. Even when the accumulated applied electrical power was increased, compared with the start of film formation there were almost no changes in each of; (1) the film formation speed, (2) the resistivity of the transparent conductive thin film, and (3) the transmittance characteristics (wavelength: 400 nm) of the transparent conductive thin film, and the transparent conductive thin film had a desired, low resistance value (9.0× $10^{-4}$ ohm-cm or less) and a high visible light transmittance (85% or more).

On the other hand, with arcing under the same conditions using the sputtering targets as in comparative examples 14 to 17, if the accumulated applied electrical power was increased for any case, arcing was generated, and nodules were produced in large quantities. As a result, it was difficult to continually use the used sputtering targets as they were.

As is clear from Table 6, in comparative examples 14 to 17 where the maximum height Rz of the surface of the sputtering target surface was 3.0 μm or more, it can be seen that there is a trend for arcing to be generated with long time sputtering. On the other hand, in examples 41 to 49 where the maximum height Rz of the sputtering surface was 3.0 μm or less, long time sputtering did not generate arcing, and the sputtering target of a thickness of 5 mm could be used until the end.

When arcing happened frequently, nodules were produced in large quantities in the vicinity of the erosion, and the resistivity and the visible light transmittance of the transparent conductive thin film manufactured was considerably worsened compared to a transparent conductive thin film manufactured when arcing was not generated.

In the transparent conductive thin films manufactured using the sputtering targets as in comparative examples 14 to 17, the resistivity and light transmittance of the transparent conductive thin film showed a decreasing trend dependant on the accumulated applied electrical power of the sputtering, and in particular, when arcing was generated, the resistivity and the transmission characteristics of the transparent conductive thin film worsened drastically.

That is to say, if a sputtering target of the present invention with a sintered body density of 6.2 g/cm³ or more, and a maximum height Rz of the sputtering face of 3.0 μm or less is used, it is possible to use the sputtering target until the end without generating arcing. Furthermore, the resistivity, and the light transmittance in the visible light range, of the transparent conductive thin film, are constant, and excellent until the end.

In a sputtering target with a sintered body density 6.2 g/cm³ or less, it was not possible to make Rz 3.0 μm or less.

Table 6 is a result of the measurements for a sputtering target where the W/In atomic number ratio was 0.007, and the Zn/In atomic number ratio was 0.054. When the oxidized sintered bodies with the compositions of examples 1, 2, and 4 to 8, and compositions of (W/In atomic number ratio, Zn/In atomic number ratio, Ag/In atomic number ratio)= (0.005, 0.010, 0), (0.012, 0.005, 0), (0.011, 0.015, 0), (0.012, 0.098, 0), (0.023, 0.095, 0), (0.006, 0.053, 0.008), (0.008, 0.096, 0.008) were used, exactly the same results were obtained. It was thus found that the surface roughness and the sintered body density of the sputtering target as determined in the present invention were important items.

7. Relationship between Crystalline Grain Size of the Oxide Sintered Body, and Crack Generation

Example 50

Oxidized sintered bodies with an average crystalline grain size of 10 μm or less, a W/In atomic number ratio of 0.007, and a Zn/In atomic number ratio of 0.054 were manufactured under the same conditions as for the manufacturing process for the sputtering target of example 3 except that just the calcination time was changed to 20 to 100 hours. The crystalline grain size of the oxidized sintered bodies was obtained from scanning electron microscope observations of the broken-out sections of the oxidized sintered bodies, and was made the average value of 100 crystalline grain sizes amongst the oxidized sintered bodies. Oxidized sintered bodies with an average crystalline grain size of 10 μm or less were able to be manufactured within a calcination time of 20 to 40 hours.

Furthermore, the sputtering target using the aforementioned oxide sintered body was attached to a cathode for non-magnetic targets of a direct-current magnetron sputtering apparatus, the target-substrate distance was made to be 80 mm, and Ar gas with a purity of 99.9999 atomic weight % was introduced, with just 5 vol % of $O_2$ gas mixed. The gas pressure was made to be 0.8 Pa. Direct-current plasma was generated, the applied power was increased, and the applied power at which cracks started to occur was obtained. Cracks were not produced even when electric power with a direct-current of 1 kW was applied for over 5 hours.

Comparative Examples 18 to 20

Oxidized sintered bodies with average crystalline grain sizes of 15 μm, 33 μm, and 49 μm, W/In atomic number ratio of 0.007, and Zn/In atomic number ratio of 0.054 were manufactured under the same conditions as for the manufacturing process for the sputtering target of example 3, except that just the calcination time was changed to 50 to 100 hours. The crystalline grain size of the oxidized sintered bodies was obtained from scanning electron microscope observations of the broken-out sections of the oxidized sintered bodies, and was made the average value of 100 crystalline grain sizes amongst the oxidized sintered bodies. Oxidized sintered bodies with average crystalline grain sizes of 15 μm, 33 μm and 49 μm were able to be manufactured within a calcination time of 50 to 100 hours.

Furthermore, the sputtering target using the aforementioned oxide sintered body was attached to a cathode for non-magnetic targets of a DC magnetron sputtering apparatus, the target-substrate distance was made to be 80 mm, and Ar gas with a purity of 99.9999 atomic weight % was introduced, with just 5 vol % of $O_2$ gas mixed. The gas pressure was made to be 0.8 Pa. Direct-current plasma was generated, the applied power was increased, and the applied power at which cracks started to occur was obtained. Cracks were produced at 600 W, and when sputtering film formation was continued unchanged, nodules were produced at the crack parts, and arcing also occurred.

As shown in example 50 and comparative examples 18 and 20, it is seen that to make a high-quality sputtering target, it is useful for the grain size of the oxide sintered body to be 0 μm or less.

When oxidized sintered bodies with compositions of not only a W/In atomic number ratio of 0.007, and a Zn/In atomic number ratio of 0.054, but also compositions as in examples 1, 2, and 4 to 8, and compositions of (W/In atomic number ratio, Zn/In atomic number ratio, Ag/In atomic number ratio)=(0.005, 0.010, 0), (0.012, 0.005, 0), (0.011, 0.015, 0), (0.012, 0.098, 0), (0.023, 0.095, 0), (0.006, 0.053, 0.008), (0.008, 0.096, 0.008) were used, the results were exactly the same.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An oxide sintered body comprising indium, tungsten and zinc, wherein tungsten is contained at a W/In atomic number ratio of 0.004 to 0.023, zinc is contained at a Zn/In atomic number ratio of 0.004 to 0.100, and resistivity is 1 k ohm-cm or less.

2. An oxide sintered body according to claim 1, wherein the resistivity is $1 \times 10^{-1}$ ohm-cm or less.

3. An oxide sintered body according to claim 1, wherein a bixbyite type indium oxide crystalline phase is a main phase.

4. An oxide sintered body according to claim 1, wherein essentially a tungsten oxide crystalline phase is not included.

5. An oxide sintered body according to claim 1, wherein the sintered body density is 6.2 g/cm³ or more.

6. An oxide sintered body according to claim 1, wherein the average crystalline grain size of the indium oxide crystalline phase is 10 µm or less.

7. A sputtering target wherein an oxide sintered body of claim 1 is processed into a tabular form, and attached to a cooling metal plate.

8. A sputtering target according to claim 7, wherein a maximum height Rz of the sputtering face is 3.0 µm or less.

9. An transparent conductive thin film in which an amorphous transparent conductive thin film is formed on a substrate using a sputtering target of claim 7, and the absolute value of the internal stress of the film is $1\times10^2$ dyn/cm$^2$ or less, and the resistivity is $9\times10^{-4}$ ohm-cm or less.

10. An oxide sintered body comprising indium, tungsten, zinc and silver, wherein tungsten is contained at a W/In atomic number ratio of 0.004 to 0.023, zinc is contained at a Zn/In atomic number ratio of 0.004 to 0.100, silver is contained at an Ag/In atomic number ratio of 0.001 to 0.010, and resistivity is 1 k ohm-cm or less.

11. A method of manufacturing an oxide sintered body comprising the steps of:
preparing $In_2O_3$ powder with an average grain size of 1 µm or less, $WO_3$ powder with an average grain size of 1 µm or less, and ZnO powder with an average grain size of 1 µm or less, so that tungsten is at a W/In atomic number ratio of 0.004 to 0.023, and zinc is at a Zn/In atomic number ratio of 0.004 to 0.100;
mixing the prepared powder for 10 to 30 hours;
granulating the mixed powder until the average grain size is 20 to 150 µm;
molding the obtained granulated powder by a cold isostatic press with a pressure of 2 to 5 ton/cm$^2$; and
sintering the obtained compact at 1200 to 1500 degree.C for 10 to 40 hours in an atmosphere where oxygen is introduced into the atmosphere of a sinter furnace at a rate of 50 to 250 liters/mm per 0.1 m$^3$ furnace volume.

12. A method of manufacturing an oxide sintered body according to claim 11, wherein in the sintering step, the temperature is raised by 0.5 to 3 degree.C/min, and in cooling after sintering, after oxygen introduction has been stopped, the temperature is decreased by 0.1 to 1 degree.C/min to 1000 degree.C.

13. A method of manufacturing an oxide sintered body according to claim 11, wherein a reductive process is further conducted to the obtained oxide sintered body by heating under a nonoxidizing atmosphere.

14. A method of manufacturing a sputtering target comprising: processing the oxide sintered body obtained by the manufacturing method of claim 11 into a tabular form; grinding the sputtering face thereof so that the maximum height Rz is 3.0 µm or less, and then attaching the oxide sintered body to a cooling metal plate.

15. A method of manufacturing an amorphous transparent conductive thin film, wherein the amorphous transparent conductive thin film is formed on a substrate, using the sputtering target obtained by the manufacturing method of claim 14, by a sputtering method with target-substrate distance at the time of sputtering 80 to 150 mm, and under the sputtering gas pressure 0.8 to 1.5 Pa.

16. A method of manufacturing a transparent conductive thin film according to claim 15, wherein the sputtering method is a DC sputtering method.

17. A method of manufacturing a transparent conductive thin film according to claim 15, wherein a gas in which $O_2$ gas of a specified quantity within the range of 0 to 15 vol % is mixed with pure Ar gas, is used for the sputtering gas, and the resistivity of the obtained transparent conductive thin film is $9 \times 10^-$ohm-cm or less.

* * * * *